United States Patent [19]

Beasley et al.

[11] 4,284,349

[45] Aug. 18, 1981

[54] MEANS FOR IMAGING A LITHOGRAPHIC PLATE

[76] Inventors: Thomas T. Beasley, 300 Maple St., Rome, N.Y. 13440; Brian G. Hanley, Box 22, Prospect, N.Y. 13435

[21] Appl. No.: 46,214

[22] Filed: Jun. 7, 1979

[51] Int. Cl.$^3$ .............................................. G03B 27/02
[52] U.S. Cl. ...................................... 355/79; 354/292; 355/75
[58] Field of Search ...................... 355/79, 75, 40, 32; 354/292

[56] References Cited

U.S. PATENT DOCUMENTS

| | | | |
|---|---|---|---|
| 2,713,294 | 7/1955 | Padgett | 354/292 X |
| 3,264,106 | 8/1966 | Alldis | 355/79 X |
| 4,159,176 | 6/1979 | DeMasi | 355/79 |

Primary Examiner—Richard A. Wintercorn
Attorney, Agent, or Firm—Bruns & Jenney

[57] ABSTRACT

A pin registration system for use in lithography wherein a photonegative of the original information to be reproduced is laid out upon a strip sheet and a sensitized lithographic plate exposed through the strip sheet to record the information thereon in the form of a developable latent image. The system includes a layout board containing a pair of registration pins of a given diameter which are in registration with a set of holes pre-cut in the lithographic plate. The strip sheet is precisely fitted upon the board over the pins and the layout work developed in reference to the location of the pins. Upon completion of the layout work, the strip sheet is cut away about the imaged areas contained on the negative and the sheet aligned with the plate using the complimentary pair of holes provided in each element and the plate exposed through the sheet to record an image of the original thereon.

6 Claims, 8 Drawing Figures

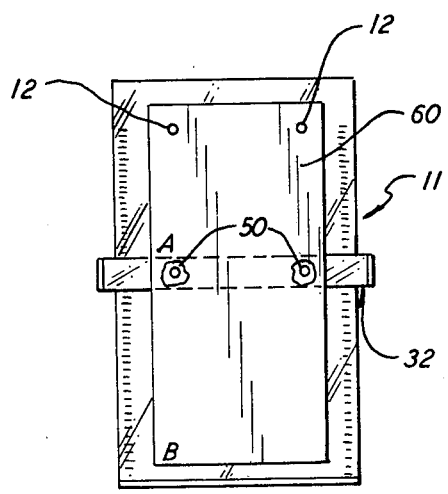
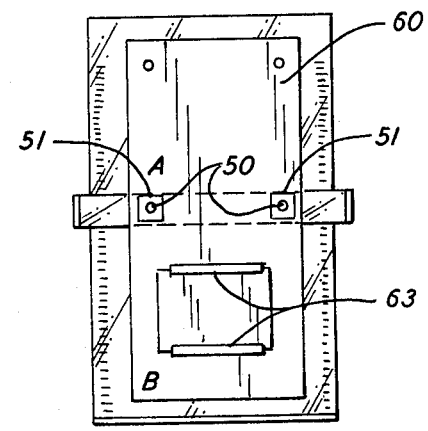
FIG. 5  FIG. 6
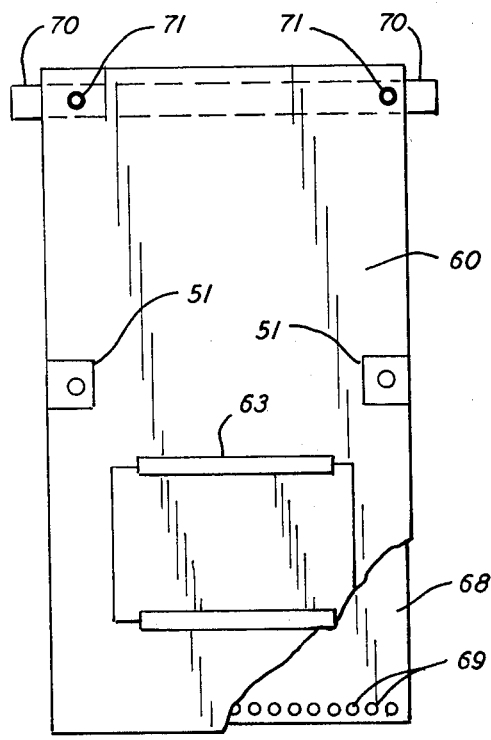
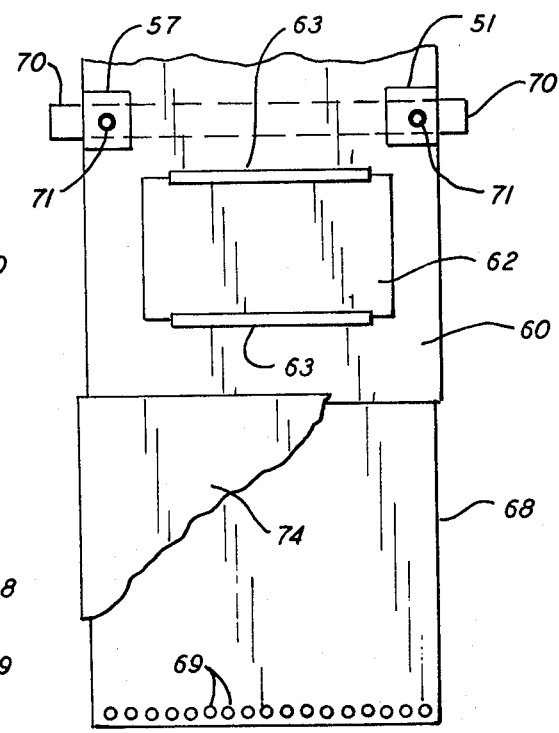
FIG. 7  FIG. 8

MEANS FOR IMAGING A LITHOGRAPHIC PLATE

BACKGROUND OF THE INVENTION

This invention relates to lithography and, in particular, to a pin registration system for use in recording a developable latent image upon a sensitized lithographic plate.

In one form of lithography, a photographic negative of the original subject matter to be reproduced is prepared in advance and the image bearing negative then positioned upon a strip sheet to create a desired format. Portions of the sheet are stripped or cut away about the imaged areas and the sheet then placed over a sensitized plate and the plate exposed through the sheet to record a developable latent image of the original upon the plate.

Typically, the edges of the strip sheet are used as reference planes from which the photonegative or negatives are located during the layout processes. However, the margins of the strip sheet do not have a direct correlation with the sensitized plate and, as a consequence, a good deal of time and effort is expended on positioning the information on the strip sheet so that it will ultimately be recorded at a desired location on the plate. The accuracy attained in preparing the lithographic plate is to a large extent dependent upon the skill and experience of the operator. As such, the procedure is subject to human error. When the procedure is complex, as in the case of the well-known step and repeat technique wherein two identical images of the original are recorded on a single plate, the chances of a human error happening are considerably increased.

SUMMARY OF THE INVENTION

It is therefore an object of the present invention to improve lithography.

A further object of the present invention is to provide an improved registration system for accurately recording information upon a lithographic plate.

Another object of the present invention is to reduce the occurrence of human errors normally encountered when preparing a lithographic plate.

A still further object of the present invention is to increase the speed and accuracy by which information is recorded upon a lithographic plate.

Yet another object is to provide a layout board for use in lithography that will permit image information contained on a strip sheet to be precisely interposed onto a lithographic plate.

Another object of the present invention is to simplify the step and repeat process used in lithography for recording two identical images of a single original upon a lithographic plate.

These and other objects of the present invention are attained by means of a layout system that includes a layout board having a flat rectangular base made of a light-transparent material that is capable of being supported in a raised position over a light table. A pair of raised registration pins are staked in the top surface of the board that are in precise registration with a set of holes pre-cut in a lithographic plate. A strip sheet, as typically used in preparing a lithographic plate, is fitted over the pins and the information to be reproduced laid out upon the sheet using the pins as a reference for locating the information during layout. After the layout work is completed, the strip sheet is registered over the plate using the complimentary hole sets provided in both the sheet and plate and the plate then exposed through the sheet to record the desired image upon a predetermined region thereof.

A second pair of movable registration pins similar to the first stationary pair are slidably mounted on the board upon a bar whereby the relative position of the second pair of pins may be adjusted in regard to the first pair to a desired position. In practice, the strip sheet is fitted over both sets of pins to establish two pairs of registration holes therein by which a single piece of information or design mounted upon the sheet may be twice recorded upon the plate employing a conventional step and repeat process.

BRIEF DESCRIPTION OF THE DRAWINGS

For a better understanding of these and other objects of the present invention reference is had to the following detailed description of the invention which is to be read in conjunction with the accompanying drawings, wherein:

FIGS. 5 and 6 are both top plan views of the present layout board showing a strip sheet fitted over the registration pins contained therein with the sheet being prepared for use in a step and repeat exposure process;

FIGS. 7 and 8 show prepared strip sheet mounted over a lithographic plate during the step and repeat exposure steps.

DESCRIPTION OF THE INVENTION

Figure 1:
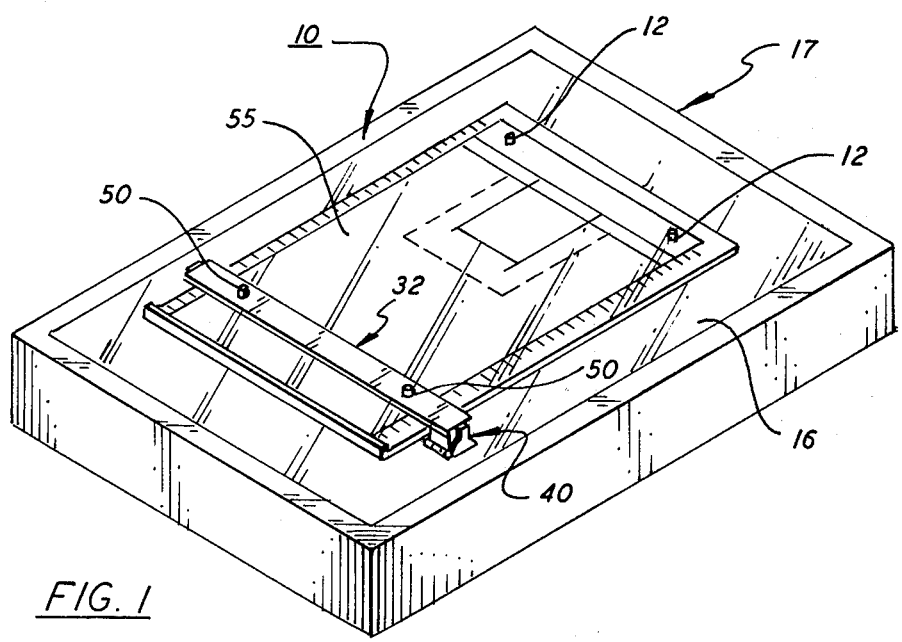
FIG. 1 is a perspective view of a light table upon which is mounted a layout board embodying the teachings of the present invention.

In one prevalent form of lithography, a sensitized metal plate is used upon which is recorded a latent image to be reproduced. The term latent image is herein used to identify an image that is capable of being developed in the lithographic process wherein moisture (water) is retained in the non-imaged plate regions and a greasy or, more precisely, a hydrophobic ink is retained in the imaged regions. Once inked, the plate is brought into contact with a transfer blanket from which the image is placed onto a final support, such as a sheet of paper, to create a faithful reproduction of the original thereon.

Lithographic plates of this nature generally are provided by the manufacturer with mounting holes along the top and bottom margins. The mounting holes are accurately die cut or punched in the plate to a precise diameter with the holes being evenly spaced at exact and equal center distances. The diameter of each hole is conventionally held at 5/32" while the center distance between holes is ½". The mounting holes have primarily been used to secure the plate to a printing drum rotatably mounted in the lithographic printing machine. Gripper pins, mounted in the printing drum, are received in close sliding relationship within complimentary holes cut in both the top and bottom margin of the plate. Through use of a tensioning mechanism, the pins are forced apart against the holding force of the plate whereupon the plate is drawn taut against the drum to prevent it from moving when placed in operation.

Heretofore, the precision built into the mounting holes arrangement of a lithographic plate has been primarily used to carry out a single purpose, that is, to facilitate mounting of the plate in the lithographic machine. As will become evident from the disclosure below, the precision mounting hole arrangement that is prepared in advance by the suppliers of lithographic plates is herein used as the basis of a registration system for rapidly and accurately preparing the plate for use in the subject printing process.

A layout board for aiding in the composing of information upon a strip sheet is shown in FIGS. 1–4 and is identified by the general reference numeral 10. The board includes a flat rectangular base 11 having a pair of stationary registration pins 12—12 staked therein so that the pins extend outwardly in perpendicular alignment with the top surface of the base. The stationary pins are located adjacent to the top edge of the base and are spaced apart at a center distance that is some multiple of one-half inch so that the pin spacing is the same as a set of mounting holes pre-cut into one margin of the plate. The pins are sized to a diameter wherein they are received with a close sliding fit within a 5/32″ diameter hole. The pins are parallel with the top edge of the base and equally spaced from the longitudinal axis thereof.

The base of the board is formed from a single sheet of rigid, heavy-duty plastic that is transparent to light. Four raised pads 15 are secured to the bottom of the board by any suitable means. The pads are made of a soft material having a high coefficient of friction that are capable of supporting the board at a raised position above the light-emitting surface 16 of a light table 17 (FIG. 1) without scratching or otherwise harming the light-emitting surface.

The two vertical side walls 20, 21 of the base are accurately formed so that the two walls are in parallel alignment with each other and perpendicular with the horizontal plane 23 that passes through the center of each stationary pin. The plane 23 forms a reference plane from which all vertical layout measurements are derived. A pair of vertical scales 25, 26 are imprinted by any suitable means along both side margins of the board to aid in the layout work. A horizontal reference line 28 is imprinted upon the surface of the board between the pins and clearly delineates the reference plane 23. A vertical reference line 30 is similarly imprinted upon the board which is centered between the two stationary pins. The vertical reference line again is utilized during layout to position the work in regard to the registration pins.

Figure 3:
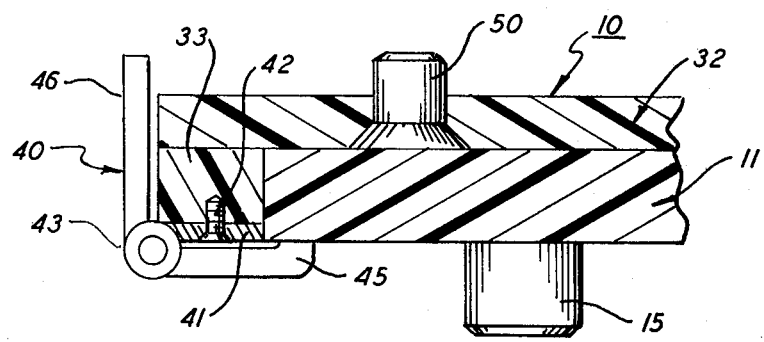
FIGS. 3 and 4 are both partial sections taken along lines 3—3 in FIG. 2 showing a pin bar slidably mounted upon the board with its side clamps illustrated in an opened and closed position.
Figure 4:
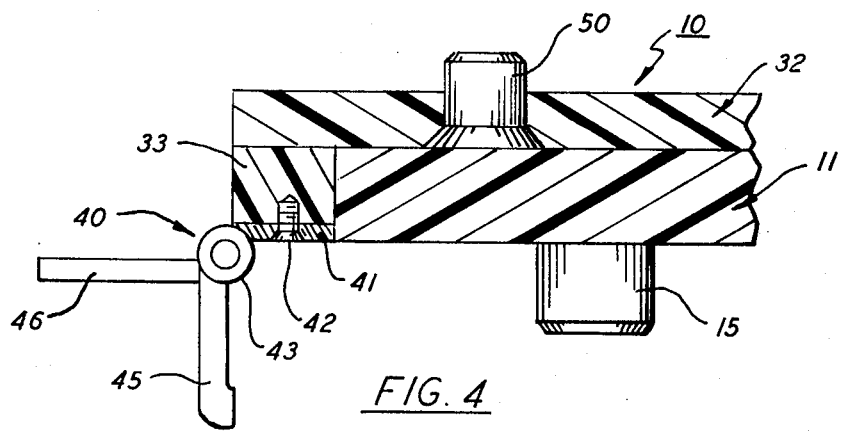
Figure 2:
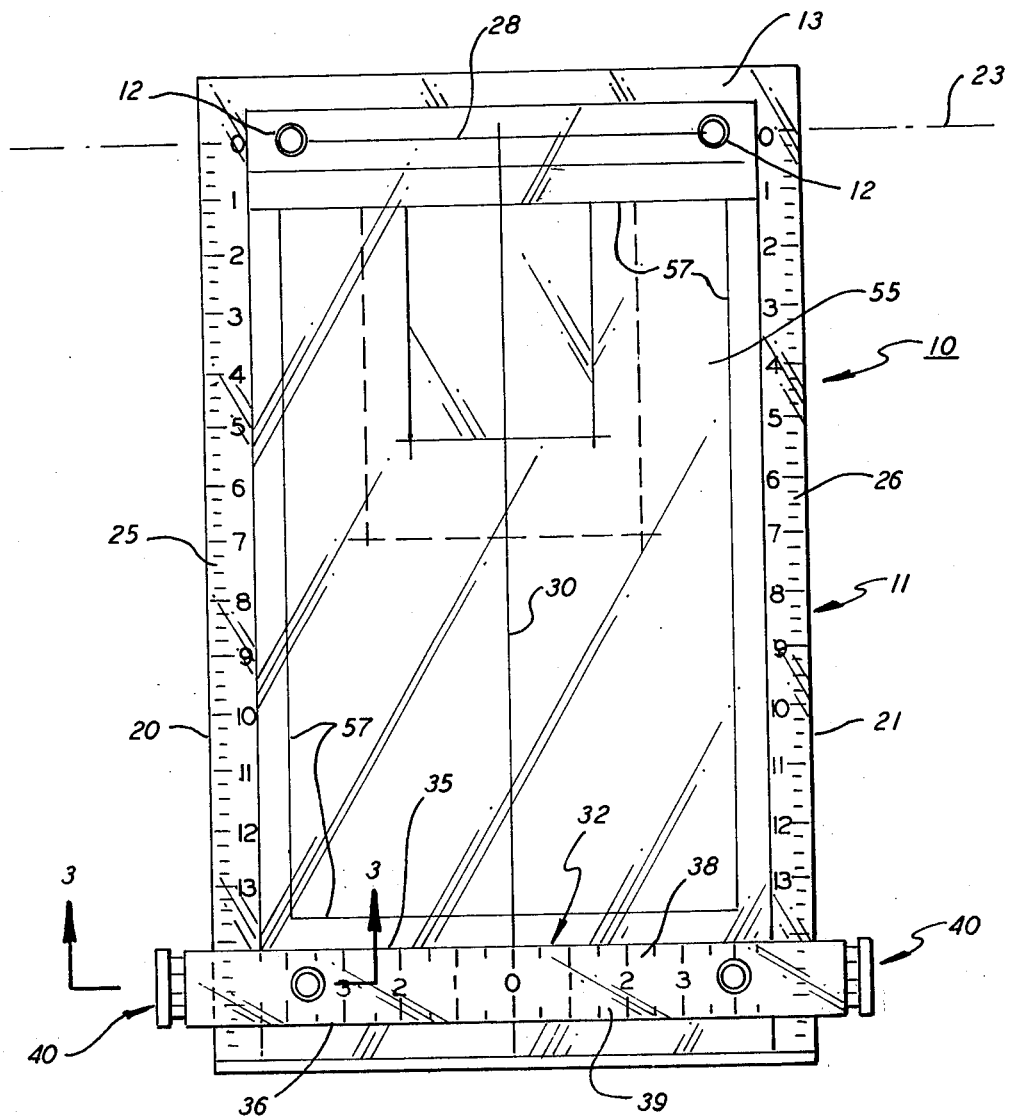
FIG. 2 is an enlarged top plan view of the layout board shown in FIG. 1 further illustrating the features of the board.

With specific reference to FIGS. 3 and 4, a bar 32 is slidably mounted upon the top surface of the base. The bar extends beyond each side margin of the base and has a guide block 33 depending downwardly from the bottom surface of the extended bar section. Each guide block is arranged to ride in close sliding relationship against the adjacent side wall of the base so that the bar will track along a path of travel that is perpendicular with the horizontal reference plane 23 as it is moved back and forth over the top surface of the base. The top and bottom edges, 35 and 36, respectively, of the bar are parallel with the horizontal reference plane 23 and are used during layout as a straight edge to aid in the layout work. Horizontal scales 38, 39 are inscribed along the top and bottom edges of the bar with both scales reading outwardly in opposite directions from the vertical reference line 30.

A pair of quick-acting clamping units, generally referenced 40, are secured to the bottom of each guide block. The units serve to secure the bar at a desired location on the board. Each unit includes a hinge 43 and a hinge plate 41 that is secured to the bottom of the guide block by screws 42. A clamp 45 is operatively connected to the hinge as is an actuating arm 46. In assembly, the hinge is spring loaded so as to urge the clamp into biasing contact against the bottom surface of the base as shown in FIG. 3. At this time the actuating arm is extended upwardly along the side edge of the bar whereby the raised portion of the arm can be engaged and turned downwardly thereby relieving the holding action of the clamp against the base. As best seen in FIG. 4, the clamp can be rotated sufficiently about the hinge to allow the bar to be removed from the board.

A pair of movable or secondary registration pins 50—50 are also staked into the bar 32. As in the case of the primary or stationary registration pins, the movable pins are spaced apart at a center distance that is equal to the center distance separating the above-noted selected set of mounting holes provided in the plate. The two movable pins are situated in the bar so that they will be parallel with the stationary pair of pins regardless of the position of the bar. As will be explained in greater detail below, the movable pins are used in conjunction with the stationary pins when laying out a strip sheet for use in the step and repeat plate imaging process.

In practice, a strip sheet to be used in exposing a lithographic plate is first mounted upon the layout board. Initially, a pair of accurately-located holes are punched or otherwise formed in the sheet along the top edge thereof. The holes are adapted to be received upon the pins with a close sliding fit. Alternatively, rough oversized holes can be made in the sheet at the approximate pin locations and, after the sheet is slipped over the pins and properly aligned on the board, fitters 51 as shown in FIG. 6 are placed over each pin and securely affixed to the sheet. As is well-known in the art, each fitter has an accurately formed hole centrally located therein for receiving registration pins and an adhesive backing surface by which the fitter is secured to the sheet.

Once the strip sheet is mounted over the primary or stationary pins, the board is placed upon a light table as shown in FIG. 1 and the layout work then accomplished with regard to the vertical and horizontal reference lines. The bar is mounted upon the board over the strip sheet and is employed in conjunction with the scales to aid in arranging the work upon the sheet.

As previously noted, the original design or subject matter to be reproduced is prepared in advance upon one or more photonegatives and the negatives mounted upon the strip sheet. The image information is laid out on the sheet so that it will overlay a prescribed region on the plate when the prepared strip sheet is brought into registration with the plate during the exposure step. As can be seen, by use of the present pin registration system all layout work that is accomplished on the board is automatically referenced with the selected set of mounting holes contained in the plate. The required layout work can thus be accomplished with a minimum amount of time and effort on the part of the user.

To further facilitate laying out of the information on the photonegatives, a thin transparent overlay 55 can be provided upon which is outlined a specific format that might be utilized by the printer on a continuing basis. In operation, the overlay is registered upon the stationary pins and minimally outlines the boundaries defining the usable imaging region on the plate. The boundaries are illustrated as lines 57—57 in FIG. 2. The geometry of the format contained within the boundary region can, of course, take any desired form. The overlay, when in use, is placed under the strip sheet so that the lined-off regions are clearly visible to the user when the board is positioned on the light table.

The invention will now be described with further reference to use in the step and repeat procedure wherein two identical images of the same original are recorded upon a single plate so that more than one copy of the original can be reproduced during each printing cycle.

To prepare the strip sheet 60 for a step and repeat exposure of the plate, the sheet is first mounted upon the board 11 over the stationary pins 12—12 in the manner described above. The bar 32 is then brought under the sheet as shown in FIG. 5 and moved to a position wherein the sheet is divided into two separate regions, an upper region A and a lower region B. Rough holes are formed in the sheet about the movable pins 50—50 to allow the sheet to lie against the board in a relatively flat condition.

With the sheet flat against the board, a pair of fitters 51—51 are passed over the movable pins and adhered to the strip sheet thereby establishing two distinct pairs of registration holes in the sheet. A photonegative containing information to be reproduced is next aligned upon the sheet at a desired position within the lower sheet region and the photonegative fixed in place using strips of masking tape 63—63. A part of the strip sheet is then cut away from about the imaged areas on the photonegative to permit light to pass freely therethrough.

The prepared strip sheet is now brought to a vacuum hold-down table upon which is mounted the lithographic plate 68 as illustrated in FIGS. 7 and 8. A registration bar 70, having a pair of registration pins 71—71 similar to the primary and secondary registration pins described above, is slipped through the selected set of mounting holes located along the top margin of the plate. These holes are similar to holes 69—69 shown in FIGS. 7 and 8. The sheet is then mounted upon the registration bar using the primary pair of registration holes whereby the photonegative overlies the bottom portion of the plate. The plate is then exposed in a conventional manner to record a first latent image thereon.

After the first exposure step is completed, the strip sheet is step registered by placing the fitters 51 over registration pins 71. This in turn, positions the photonegative over the upper portion of the plate as shown in FIG. 8. A sheet of opaque paper 74 is placed over the exposed lower region of the plate and a second exposure made. As can be seen, by use of the present system, the many steps involved in carrying out the step and repeat process can be quickly and accurately accomplished while at the same time minimizing the effects of human error.

While this invention has been described with reference to the structure disclosed herein, it is not confined to the details set forth and this application is intended to cover any modifications or changes as may come within the scope of the following claims.

We claim:

1. A layout board for use in carrying out a lithographic step and repeat process wherein one original containing information to be reproduced is mounted upon a strip sheet so that the sheet can be further used to provide two independent images upon a single lithographic plate having mounting holes along the top and bottom margins that are spaced apart at one-half inch intervals, the board including a base section having a work surface that is light transmitting and two parallel guide rails extending along the length of the work surface, a central reference line inscribed on the work surface that is parallel with the guide rails and which extends vertically along the length of the work surface, a first pair of stationary registration pins that are coaxially aligned in the top of the work surface upon a common center line that is perpendicular to said central reference line, said stationary registration pins being equally spaced to either side of the central reference line and having a center distance that is some fixed multiple of the half-inch hole spacing contained in the plate, a straight edge that is slidably mounted upon the work surface of the base section having a pair of slide members that ride in sliding contact against the side edges of the base section whereby the straight edge moves vertically along the work surface, a second pair of raised registration pins mounted in the straight edge for movement therewith, said pins being equally spaced on either side of said central reference line and having a center distance equal to that of said first pair of registration pins whereby said first and second pair of pins are moved towards or away from each other as the straight edge is slidably repositioned on the work surface, a horizontal reference line inscribed upon the base section that is aligned along the common center line of said first pair of stationary registration pins, and a vertical scale inscribed along one of the side edges of the board containing a number of equally spaced graduations for permitting accurate positioning of the straight edge in regard to the horizontal reference line.

2. The layout board of claim 1 that further includes a clamping means secured to the straight edge that is operable to lock the straight edge against the base section.

3. The layout board of claim 1 wherein the diameter of each registration pin is slightly less than the diameter of the mounting hole contained in the lithographic plate.

4. The layout board of claim 1 that further includes a horizontally extended scale inscribed thereon having equally spaced graduations extending outwardly in both directions to either side of the central reference line.

5. The layout board of claim 4 wherein said horizontally extended scale is inscribed upon the face of said straight edge.

6. The layout board of claim 1 that further includes a thin transparent overlay having a set of locating holes in the top margin thereof that are in register with the first pair of registration pins to permit the overlay to be accurately mounted upon the work surface and said overlay containing a grid pattern for providing a format for accurately aligning the original upon the work surface.

* * * * *